US005650356A

United States Patent [19]
Grivna et al.

[11] Patent Number: 5,650,356
[45] Date of Patent: Jul. 22, 1997

[54] METHOD FOR REDUCING CORROSION IN OPENINGS ON A SEMICONDUCTOR WAFER

[75] Inventors: Gordon M. Grivna, Mesa; Gregory W. Grynkewich, Gilbert; Thomas S. Roche, Scottsdale, all of Ariz.

[73] Assignee: Motorola, Inc., Schaumburg, Ill.

[21] Appl. No.: 613,327

[22] Filed: Mar. 11, 1996

Related U.S. Application Data

[60] Continuation of Ser. No. 441,557, May 15, 1995, abandoned, which is a division of Ser. No. 694,155, May 1, 1991, Pat. No. 5,453,401.

[51] Int. Cl.$^6$ ...................................................... H01L 21/44
[52] U.S. Cl. .......................... 437/194; 437/197; 437/198; 156/656.1
[58] Field of Search ............................. 156/656, 665; 437/194, 197, 198

[56] References Cited

U.S. PATENT DOCUMENTS

| | | | |
|---|---|---|---|
| 3,844,831 | 10/1974 | Cass et al. | 117/212 |
| 4,197,141 | 4/1980 | Bozler et al. | 136/89 TF |
| 4,361,950 | 12/1982 | Amick | 29/572 |
| 4,419,183 | 12/1983 | Gulla et al. | 156/666 |
| 4,451,326 | 5/1984 | Gwozdz | 156/643 |
| 4,632,852 | 12/1986 | Akahoshi et al. | 427/437 |
| 4,668,335 | 5/1987 | Mockler et al. | 156/643 |

OTHER PUBLICATIONS

Stanley Wolf et al., "Silicon Processing for the VLSI Era", vol. 1:Process Technology, Lattice Press, Sunset Beach, CA.

*Primary Examiner*—Benjamin Utech
*Attorney, Agent, or Firm*—Gary F. Witting; George C. Chen

[57] ABSTRACT

A method is provided for reducing corrosion in openings on a semiconductor wafer. An etched opening is provided in a dielectric material on the semiconductor wafer. The etched opening and the dielectric material are cleaned with a basic solution. The exposed metal surface is treated with a hydrogen peroxide solution before exposing the exposed metal surface to an aqueous solution.

12 Claims, No Drawings

5,650,356

METHOD FOR REDUCING CORROSION IN OPENINGS ON A SEMICONDUCTOR WAFER

This application is a continuation of U.S. patent application Ser. No. 08/441,557, filed May 15, 1995, now abandoned, which is a divisional of U.S. patent application Ser. No. 07/694,155, filed May 1, 1991, now U.S. Pat. No. 5,453,401.

BACKGROUND OF THE INVENTION

This invention relates, in general, to semiconductors, and more particularly to processing of semiconductors wafers.

Corrosion or microcorrosion of metal films or metal surfaces that are used in manufacturing semiconductors has been a problem for a long time. Corrosion, which is an unintentional removal of metal from a metal film or from a metal surface, results in holes, depressions, voids, or openings being formed in the metal film or the metal surface. These holes, voids, depressions, or openings further result in electrical problems, such as noncontact, degraded or marginal contact, and decreased reliability, thereby producing marginal semiconductor devices.

Corrosion of metal surfaces or metal films that are made of aluminum alloys that have been doped with a copper impurity are especially susceptible to corrosion. The addition of the copper impurity to a predominantly aluminum film while having some benefits, such as hillock reduction and electromigration reduction, causes severe corrosion problems. Additionally, continual shrinking of geometric features have further exacerbated the corrosion problems of these films.

Therefore, a method to reduce corrosion in a simple, inexpensive, and an easily implemented procedure or method would be highly desirable.

SUMMARY OF THE INVENTION

Briefly, according to the invention, a method is provided for reducing corrosion of a metal film that contains at least aluminum and copper and having an exposed portion. The metal film with the exposed portion is treated with hydrogen peroxide, thereby providing a protective coating to reduce corrosion of the metal film.

DETAILED DESCRIPTION

Described in the present invention is a process to reduce metal corrosion or microcorrosion. Corrosion is an unintentional removal of metal from a metal surface. The metal surface can be a continuous film or formed into patterns, such as lines or features of variously shaped geometries. Commonly the metal surface is deposited onto a surface of a semiconductor wafer.

A typical metal film that is used to fabricate metal patterns for semiconductor devices is an aluminum alloy containing a copper additive. It should be understood however that other additives, such as silicon, can be used in conjunction with the copper additive. Typically, metal films are used in semiconductor fabrication to make electrically conductive patterns, such as electrically conductive lines and electrically conductive features. Generally, the copper and the silicon dopants or additives range from 0.5 percent to 4.0 percent. Doping of the aluminum film with copper, while providing some benefits, such as reduced electromigration and reduced hillock formation, nevertheless, causes an increased amount of corrosion or unwanted removal of the metal from patterns or films to occur during normal processing. It is believed that the increase in corrosion of a copper doped aluminum film occurs because of at least two interrelated reasons. First, damaging or a weakening of a protective film that naturally surrounds most metal surfaces. This damaging of the protective film occurs during conventional processing methods that are used to make semiconductor products or devices. When this protective film is weakened or removed by any manner, a naked or an unprotected metal surface results, which is chemically reactive. Second, by using copper additives, especially higher percentages of copper additives, a segregation or migration of copper from grains of the deposited aluminum copper film and into a grain boundary or between the grains of the deposited aluminum copper film occurs, forming a copper rich nodule. Once the protective film is damaged a reactive metal surface is exposed. A typical chemical reaction that is believed to occur when both a reactive aluminum and reactive copper surface is immersed in deionized water is a galvanic reaction. Additionally, it should be understood that many more than one nodule is formed during the segregation process of the aluminum copper film.

By way of example, corrosion of a metal surface occurs during cleaning of a via or vias after they have been etched. Typically, a via is a hole in a dielectric material between two metal layers that have been patterned. These openings or vias are etched through the dielectric to the first metal layer. Also, etching commonly is achieved by reactive ion etching (RIE); however, other etching techniques can be used.

Typically, the insulating or dielectric material is photolithographically patterned with openings that are on the dielectric material. Once the pattern from the photolithographic technique is transferred into the dielectric material, thereby cutting an opening to the first metal layer, the remains of the photoresist is cleaned or removed by conventional wet removal techniques. Conventional wet removal techniques generally are comprised of a photoresist stripper solution, such as heated EKC 830 or other amine based photoresist strippers, followed by a deionized water rinse. Generally, the photoresist stripper, which is typically a strong basic solution, not only removes the remaining photoresist pattern, but also removes or damages the protective layer from the first metal layer, thus exposing a naked metal or unprotected surface. It should be understood that it is also possible that the RIE etching of the vias can remove the protective layer from the first metal surface. It should be evident that cleaning of an RIE etched via with conventional methods would only aggravate the damage or removal of the protective layer, thus further worsening the corrosion problem. Once the protective layer is removed or damaged by the photoresist stripper, the etched pattern is rinsed in deionized water. It is further believed that the deionized water corrodes the exposed first metal surface in the via opening. Corrosion of the first metal surface in the via opening can cause several problems, such as not being able to make contact or making only marginal contact to the first metal when a subsequent metal layer is deposited. In either case reliability issues are a concern.

Generally, corrosion of the naked metal surfaces of the first metal layer is thought to be due to a formation of a microgalvanic cell that is formed by the aluminum, the copper, and the deionized water. Briefly, the microgalvanic cell is caused by two dissimilar metals in contact with each other, with the aluminum being an anode, the copper being a cathode, and the deionized water being a solution in which the reaction takes place.

However, in the present invention the protective layer is regenerated or reformed prior to rinsing with deionized water, thereby protecting the film and not allowing for the galvanic reaction to take place. Protection of the metal by exposing the naked or damaged metal surface to a strong oxidizing solution, such as hydrogen peroxide, while not fully understood, is believed to be accomplished by regenerating or reforming the protective layer.

In the present invention, after the via structures have already been cleaned with the photoresist stripper, the via or vias are exposed to a solution of hydrogen peroxide prior to rinsing with deionized water. Exposing the via or vias to a solution of hydrogen peroxide before the deionized water rinse, the protective layer, which is believed to be a thin layer of oxide, is reformed on the naked metal surface, thereby protecting the metal film when it is rinsed in deionized water. This prevents corrosion or the galvanic reaction from taking place.

Typically, a hydrogen peroxide solution that is used has a range of concentrations between 10 percent by weight and 50 percent by weight, with a temperature range between 20 degrees Celsius to 50 degrees Celsius for regeneration of the protective layer on the naked exposed metal surface. Exposure time or application time of the naked metal surface in the hydrogen peroxide solution ranges between 1.0 minute to 10.0 minutes. It is however preferred to have the concentration, temperature, and time adjusted substantiality to 30 percent by weight, room temperature or 22 degrees Celsius, and 5.0 minutes respectively. It should be understood that concentration, temperature, and time are all interrelated; therefore, changing a parameter or parameters will alter the formation of the protective layer. Application of the hydrogen peroxide solution can be easily achieved by immersing the unprotected metal surface into a hydrogen peroxide bath or the like. This immersion can be done by providing an additional heated or unheated hydrogen peroxide bath where necessary. However, other methods of applying or dispensing hydrogen peroxide could also be used, such as an automatic liquid dispensing system that is commonly used in semiconductor manufacturing.

In another embodiment, patterning of the metal surfaces is achieved by commonly used photolithographic methods. Briefly, the metal film surface is patterned by applying a photoresist material on the surface of the metal film. The photoresist material is exposed and developed, leaving patterns of photoresist material on the metal surface. Development of the photoresist material typically is done by using a basic solution, called a developer, applying the developer onto the exposed photoresist material, thereby washing the exposed portions of the photoresist film away, leaving the unexposed portions of the photoresist in place on the metal surface. It is believed that the developer either removes or damages the protective film that normally covers the metal surfaces, therefore exposing a naked or unprotected metal surface or surfaces. The developer solution is rinsed away by using deionized water; however, since portions of the protective film on the metal surface have been damaged, these damaged exposed metal portions corrode due to the deionized water as discussed previously in this document.

Typically, several problems can result from corrosion by this commonly used method for patterning the metal film. First, since the photoresist pattern crosses grain boundaries and in those grain boundaries will be copper rich nodules, a galvanic reaction will take place and corrodes around the nodules. This removal causes a notch or an undercut in the metal under the photoresist, thereby causing a notch in the pattern in the metal surface after etch. Notches or removed material from small patterns severely limits current to passing as originally designed, as well as potentially causing long term reliability problems.

Second, the metal surface which has been damaged by corrosion, will not etch uniformily in a dry etch system. Metallic residues are often left behind at corrosion sites after dry etching the metal surface.

Third, if for any reason the photoresist pattern has to be removed from the metal surface and repatterned, it should be evident that the metal surface is already damaged by developing the pattern previously. In addition, the remaining photoresist pattern is usually removed by the photoresist stripper solution that has been discussed previously. It should be evident that removing the remaining portions of the photoresist pattern by the photoresist stripper solution will only further damage or remove the protective layer.

However, in the present invention, applying a solution of hydrogen peroxide to the exposed metal surfaces after developing the photoresist and before rinsing in deionized water creates the protective layer so that corrosion will be reduced or eliminated.

Additionally, it should be realized that some benefits may be realized by providing several applications of a progressively cleaner stripper solution or a combination of different stripper solutions, as well as developer solutions prior to the application of the oxidizing agent or hydrogen peroxide to the surface of the naked or unprotected metal surface.

By now it should be appreciated that a method has been provided for reducing or eliminating corrosion of an unprotected metal surface. The corrosion is believed to be caused by weakening or removal of a protective layer that normally covers the metal surface. Also, the method can be easily and inexpensively implemented in a process.

We claim:

1. A method for fabricating a semiconductor device, the method comprising the steps of:

providing a substrate;

providing a metal layer overlying the substrate;

providing a photoresist layer overlying the metal layer;

applying a basic solution to the photoresist layer;

applying hydrogen peroxide to the photoresist layer and the metal layer, wherein the hydrogen peroxide is in an aqueous solution and wherein the step of applying the hydrogen peroxide occurs after the step of applying the basic solution: and applying a solution of deionized water to the metal layer after the step of applying the hydrogen peroxide.

2. The method of claim 1 wherein the step of applying the hydrogen peroxide includes applying the hydrogen peroxide at a temperature of approximately 20 degrees Celsius to 50 degrees Celsius.

3. The method of claim 2 wherein the step of applying the hydrogen peroxide includes applying the hydrogen peroxide at a temperature of substantially 22 degrees Celsius.

4. The method of claim 1 wherein the step of applying the hydrogen peroxide includes applying the hydrogen peroxide at a concentration of approximately 10 percent by weight to 50 percent by weight in the aqueous solution.

5. The method of claim 4 wherein the step of applying the hydrogen peroxide includes applying the hydrogen peroxide at a concentration of approximately 30 percent by weight in the aqueous solution.

6. The method of claim 1 wherein the step of applying the hydrogen peroxide includes applying the hydrogen peroxide for approximately 1.0 minute to 10.0 minutes.

7. The method of claim 6 wherein the step of applying the hydrogen peroxide includes applying the hydrogen peroxide for approximately 5.0 minutes.

8. The method of claim 1 wherein the step of applying the basic solution includes providing a photoresist developer for the basic solution and wherein the metal layer is devoid of direct contact with a solution of deionized water between the steps of applying the basic solution and applying the hydrogen peroxide.

9. A method for fabricating a semiconductor device, the method comprising the steps of:

providing an opening in a dielectric material to expose a metal surface, the metal surface overlying a semiconductor substrate;

exposing the dielectric material and the metal surface to a basic solution;

treating the metal surface and the dielectric material with hydrogen peroxide, wherein the hydrogen peroxide is in a first aqueous solution and wherein the treating step occurs before exposing the metal surface to a second aqueous solution deionized water and wherein the treating step occurs after the step of exposing the dielectric material and the metal surface to the basic solution; and exposing the metal surface to the second aqueous solution after treating the metal surface with the hydrogen peroxide.

10. The method according to claim 9, wherein the step of treating the metal surface with the hydrogen peroxide includes providing the first aqueous solution at a temperature of approximately 20 to 50 degrees Celsius, providing the hydrogen peroxide at a concentration of approximately 10 to 50 percent by weight in the first aqueous solution, and treating the metal surface for approximately 1.0 to 10.0 minutes with the first aqueous solution.

11. The method according to claim 10, wherein the step of providing the first aqueous solution includes providing the first aqueous solution at a temperature of approximately 22 degrees Celsius, wherein the step of providing the hydrogen peroxide includes providing the hydrogen peroxide at a concentration of approximately 30 percent by weight in the first aqueous solution, and wherein the step of treating the metal surface includes treating the metal surface for approximately 5.0 minutes with the first aqueous solution.

12. The method according to claim 9, further comprising providing aluminum and copper for the metal surface.

* * * * *